US009065507B2

(12) United States Patent
Trotta et al.

(10) Patent No.: US 9,065,507 B2
(45) Date of Patent: Jun. 23, 2015

(54) MIXING STAGE, MODULATOR CIRCUIT AND A CURRENT CONTROL CIRCUIT

(71) Applicant: Infineon Technologies AG, Neubiberg (DE)

(72) Inventors: Saverio Trotta, Munich (DE); Herbert Knapp, Munich (DE)

(73) Assignee: Infineon Technologies AG, Neubiberg (DE)

( * ) Notice: Subject to any disclaimer, the term of this patent is extended or adjusted under 35 U.S.C. 154(b) by 114 days.

(21) Appl. No.: 14/019,028

(22) Filed: Sep. 5, 2013

(65) Prior Publication Data
US 2015/0065071 A1    Mar. 5, 2015

(51) Int. Cl.
*H04B 1/02*    (2006.01)
*H04B 1/66*    (2006.01)
*H04B 1/04*    (2006.01)

(52) U.S. Cl.
CPC ................................. *H04B 1/0475* (2013.01)

(58) Field of Classification Search
CPC ................. H02M 3/33507; H02M 2001/0006; H02M 7/53871; H03F 1/0222; H04B 1/0082; H04B 1/02; H04B 1/66; H04W 52/0209; H03B 23/00; H03B 5/22; H03C 1/20; H03C 1/52; H04M 19/02; H04C 1/52
USPC .......... 455/102, 108–111, 113, 91, 103–104, 455/114.1, 115.1
See application file for complete search history.

(56) References Cited

U.S. PATENT DOCUMENTS

| 7,251,462 B2* | 7/2007 | Matsuura et al. | 455/108 |
| 8,140,030 B2* | 3/2012 | Takinami et al. | 455/108 |
| 8,923,436 B2* | 12/2014 | Hori | 375/300 |
| 2009/0258611 A1* | 10/2009 | Nakamura et al. | 455/108 |
| 2011/0183636 A1* | 7/2011 | Staudinger et al. | 455/102 |

FOREIGN PATENT DOCUMENTS

DE    102010029659 A1    12/2010

OTHER PUBLICATIONS

Treyer, et al. "Investigation of a Self-Calibrating SSB Modulator." IEEE Transactions on Microwave Theory and Techniques, vol. 53, No. 12, Dec. 2005. 11 Pages.

* cited by examiner

*Primary Examiner* — Pablo Tran
(74) *Attorney, Agent, or Firm* — Eschweiler & Associates, LLC

(57) ABSTRACT

A mixing stage includes a first modulation stage that receives an input signal from a first common node of the mixing stage, a first local oscillator input that receives a local oscillator signal, and a first modulation signal output adapted to provide a first modulated signal. A second modulation stage of the mixing stage includes a second input that receives a phase inverted representation of the input signal from a second common node of the mixing stage, a second local oscillator input that receives the local oscillator signal, and a second modulation signal output adapted to provide a second modulated signal. A current generation circuit provides a supply current to the first common node and to the second common node. A current control circuit is adapted to superimpose an offset current to the current of at least one node of the first common node and the second common node.

13 Claims, 9 Drawing Sheets

MIXING STAGE, MODULATOR CIRCUIT AND A CURRENT CONTROL CIRCUIT

FIELD

Embodiments relate to a mixing stage, a modulator circuit for providing a single-side band signal using a mixing stage and a current control circuit for a mixing stage.

BACKGROUND

Mixing stages or signal mixers are used in various implementations, for example in communication systems. In those applications, mixing stages may be used to mix or superimpose a baseband or intermediate frequency signal to a carrier frequency prior to the submission or sending of the generated modulated carrier frequency signal. Examples of those applications are sending or receiving stages of mobile telecommunication handsets or base stations, terrestrial radio senders and the like. Generally, mixing stages are used in multiple applications where an information signal is to be transmitted or received by means of wireless or wired transmission techniques.

One particular quality criterion for a mixing stage is the achieved signal quality, for example in terms of a spectrum of the signal provided at an output of the mixing stage. For example, it may be required that a modulator circuit for providing a single-side band modulated signal (SSB) provides a spectrum showing only the single transmitted side band without spectral components of the carrier frequency or the complementary side band. To this end, Hartley Modulators are sometimes used, inherently providing carrier suppression and suppression of one of the two side bands due to its concept. Further, mixer stages such as for example Gilbert Cells are sometimes used, which may also provide for an inherent suppression of the carrier or local oscillator (LO) frequency. Those type of mixer stages or modulators are, therefore, also called balanced devices.

Mixing stages typically comprise multiple semiconductor devices, for example bi-polar transistors or field-effect transistors, which have slightly different characteristics due to process fluctuations. Due to those differences within the participating components and also due to fluctuations within the signals used as an input to the modulation stages, also balanced devices may require some additional circuitry in order to counterbalance the imbalances present.

However, additional balancing circuitry may be costly in terms of area and production costs, in particular when the imbalances shall be counterbalanced with a high accuracy. The cost and complexity of such balancing circuitry should be reduced.

SUMMARY

Embodiments may achieve a reduction in the complexity of balancing circuits for a mixing stage comprising two modulation stages in that a current control circuit is coupled to a common node between an input of the first modulation stage and a current generation circuit and to a second common node between a second input to the second modulation stage and the current control circuit. The current control circuit is adapted to superimpose an offset current to the current of at least one node of the first common node and the second common node. That is, an offset current may be superimposed directly to a supply current or to the input signal at a node between the current generation circuit and the input of the modulation stages. This may decrease the complexity of the current control circuit and, hence, result in cost and area saving of the mixing stage as well as in an increase in the reliability of the mixing stage.

According to some embodiments, a current control circuit for superimposing an offset current to a current provided to an information signal input of a mixing stage makes use of a current mirror circuit adapted to provide the output current. To this end, the current mirror circuit is coupled to the output terminal of the current control circuit. A digital-to-analog converter is coupled to the current mirror circuit such that a variation of the output voltage of the digital-to-analog converter causes a variation of the output current of the current mirror circuit. Using a current mirror circuit to provide a current to be superimposed to the information signal input of a mixing stage may allow to directly couple the current mirror circuit to an input of a modulation stage since an output of the current control circuit has a high impedance so that a current superimposes to the input of the modulation stage without flowing into another component of a mixing stage.

A modulator circuit according to further embodiments comprises two embodiments of mixing stages to provide for the possibility of deriving or creating a single-side band modulated signal. That is, the modulator circuit comprises a first mixing stage and a second mixing stage. The outputs of the mixing stages are combined, i.e. the modulator circuit further comprises a signal combiner. The signal combiner is coupled to a first mixing stage output of the first mixing stage as well as to a second mixing stage output of the second mixing stage. The first mixing stage output is coupled to the first modulation signal output and to the second modulation signal output of the first mixing stage and the second mixing stage output is coupled to the first modulation signal output and to the second modulation signal output of the second mixing stage.

That is, the signal combiner is coupled to each of the modulation signal outputs of both mixing stages in order to be able to combine signals having a contribution of each of the modulation signal outputs of the two mixing stages. By superimposing, e.g. adding, the signals of the first mixing stage output and the second mixing stage output, a resultant signal may be provided in which one of the side bands generated by the mixing of signals within the mixing stages may be suppressed to some extent. Using embodiments of mixing stages for the modulator may also provide for the possibility of controlling the current control circuits of the mixing stages such that the contribution of a signal oscillating with the local oscillator frequency is decreased.

BRIEF DESCRIPTION OF THE DRAWINGS

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
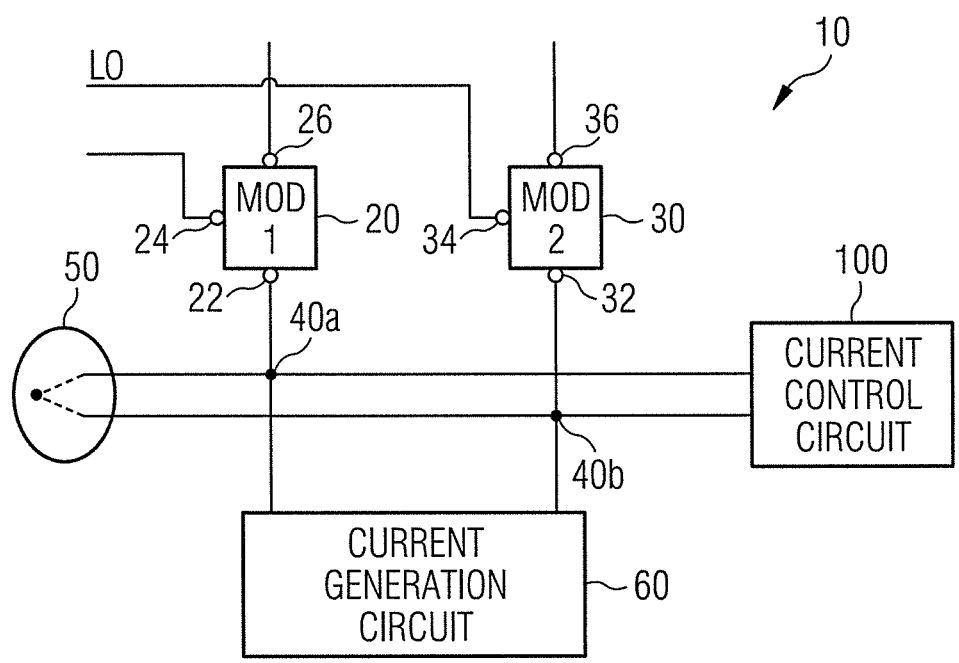
FIG. 1 illustrates an embodiment of a mixing stage.

FIG. 1 illustrates an embodiment of a mixing stage 10. The mixing stage 10 comprises a first modulation stage (MOD1) 20 and a second modulation stage (MOD2) 30. The first modulation stage 20 comprises an input 22 adapted to receive an input signal, a first local oscillator (LO) input 24 adapted to receive a local oscillator signal oscillating with a predetermined local oscillator frequency and a first modulation signal output 26 adapted to provide a modulated signal. The modulated signal depends on the local oscillator signal and on the input signal. Modulation stages or modulators of that kind are, for example, used to modulate a signal containing information onto a carrier frequency in mobile telecommunication applications. The modulated radiofrequency (RF) signal is then amplified and fed to radiators of associated antenna systems. An ideal modulator modulating an input signal having a frequency $f_{if}$ and a local oscillator frequency $f_{lo}$ creates an output signal having a spectrum peaking at the frequencies $f_{lo}-f_{if}$ and $f_{lo}+f_{if}$.

However, in practical implementations, frequency components corresponding to $f_{lo}$ and $f_{if}$ are also present within the modulated signals at a signal output of the modulators. Balanced modulators try to partly alleviate this imperfection by using redundant circuitry and differential signals such that DC-offsets of the input signal and of the local oscillator signal cancel at least partly at a differential output of the balanced mixer. For a similar purpose, the mixing stage 10 of FIG. 1 further comprises the second modulation stage 30 having a second input 32, a second local oscillator input 34 and a second modulation signal output 36. The second input 32 is adapted to receive a phase-inverted representation of the input signal.

The first input 22 of the first modulation stage 20 is coupled to a first common node 40*a* of the mixing stage 10 and the second input 32 of the second modulation stage 30 is coupled to a second common node 40*b* of the mixing stage 10. The first common node 40*a* and the second common node 40*b* are coupled to an information signal input 50 of the mixing stage 10 which, therefore, provides for the possibility of operating the mixing stage 10 with a differential or complementary input of the information signal. I.e. a differential signal may be modulated onto the local oscillator frequency in different branches of the circuit.

The embodiment of a mixing stage 10 further comprises a current generation circuit 60 for providing a supply current, the current generation circuit 60 being coupled to the first common node 40*a* and to the second common node 40*b*. The provision of a supply current to the first common node 40*a* and to the second common node 40*b* may be required in order to provide a working point for the first modulation stage 20 and the second modulation stage 30. That is, the current generation circuit 60 provides a DC-current to which a current of the signal provided at the information signal input 50 superimposes at the first common node 40*a* and at the second common node 40*b* to be used at the first input 22 and the second input 32 of the current controlled modulation stages 20 and 30.

The mixing stage 10 further comprises a current control circuit 100 coupled to the first common node 40*a* and to the second common node 40*b*. The current control circuit 100 is adapted to superimpose an offset current to the current of at least one node of the first common node 40*a* and the second common node 40*b*. That is, a current may be additionally superimposed to the current at the first common node 40*a* or at the second common node 40*b* or to both common nodes 40*a* and 40*b* simultaneously. This, in turn, may provide for the possibility of balancing the signal at the first modulation signal output 26 with respect to the signal at the second modulation signal output 36. Balancing may be used to compensate for asymmetries in the layout. Further, balancing may be used to compensate for variations within the characteristics of the semiconductor devices constituting the first modulation stage 20 and the second modulation stage 30.

Superimposing a current to at least one of the first common node 40*a* and the second common node 40*b* may provide for the possibility of suppressing signal components of the local oscillator signal in the modulated signal determined by using the first modulation signal output 26 and the second modulation signal output 36 as a differential output of the mixing stage 10. As a general rule, self-biasing or asymmetry in the modulator may lead to a significant contribution of a signal with the local oscillator frequency at the output of the mixing stage 10. Correspondingly, an imperfect local oscillator signal creates strong signal components with a frequency corresponding to the frequency of the input signal and its phase-inverted representation as provided to the information signal input 50. In other words, self-biasing or a deviation of the duty cycle of the local oscillator signal (LO-signal) leads to or could introduce imbalances in the overall circuit. Imbalances result in a limited suppression of the LO-signal itself (LO-leakage) or induce the presence of information signal components within the modulated signals. Non-idealities within the information signal at the information signal input 50 lead to limited suppression of the local oscillator signal within the modulation signal outputs 26 and 36.

The current control circuit 100, however, may avoid the presence of a local oscillator signal component within the first modulated signal and the second modulated signal by injecting or superimposing an offset current to at least one of the first common node 40a or the second common node 40b so as to counterbalance any imbalances or so as to introduce an artificial imbalance to achieve a high suppression of the local oscillator signal LO within the output signal.

In other words, the current control circuit 100 may be used to achieve an effective LO-suppression of the mixing stage 10, i.e. an efficient or high suppression of the presence of a component with the local oscillator frequency in the output signal of the mixing stage 10.

By superimposing the current directly to the first common node 40a or to the second common node 40b, the complexity of the current control circuit 100 may be reduced as compared to conventional approaches where an injection of an additional current or the superposition of a current is performed within the current generation circuit 60. If the offset current superimposed by the current circuit is modified in finite quantities, the granularity may be decreased. That is, only a comparatively small amount of different possible currents need to be generated by the current control circuit as compared to conventional approaches performing a superposition of an additional current by means of the current generation circuit 60.

Figure 3:
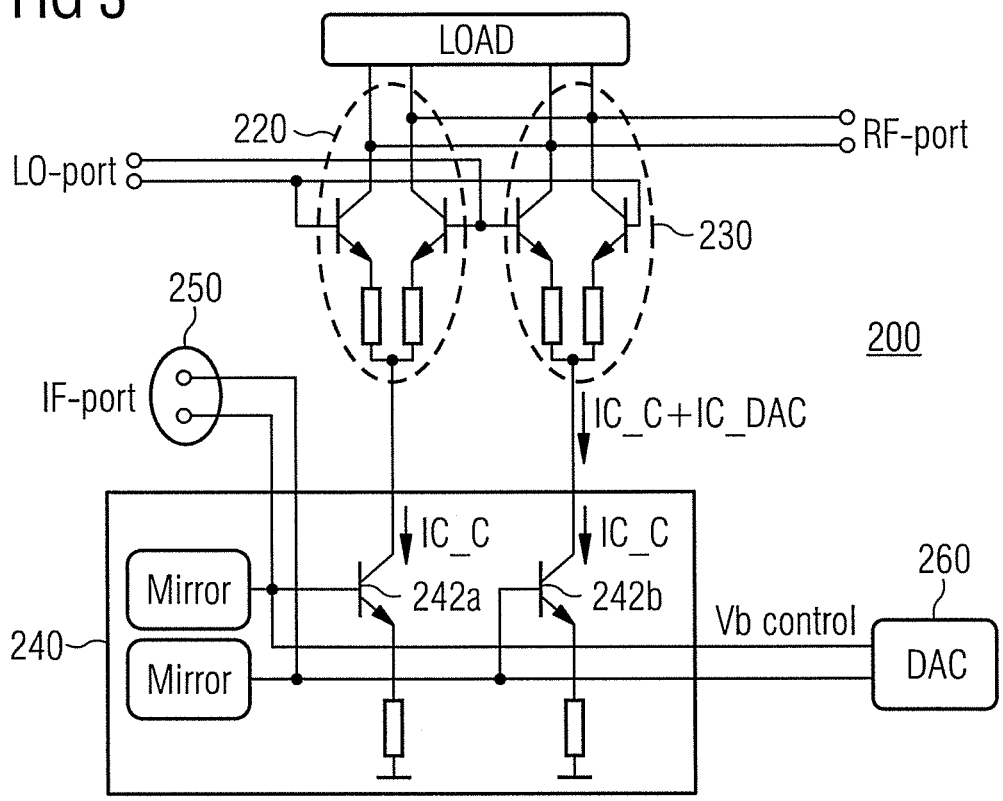
FIG. 3 illustrates a conventional mixing stage.

An example for such a conventional approach is illustrated in FIG. 3. The current generation circuit 240 of the conventional approach of FIG. 3 comprises two transistors 242a and 242b as a current source. According to the conventional approach, a current at the inputs of the first and second modulation stages 220 and 230 is modulated by a modulation of the current of the base terminals of the current sources 242a and 242b. That is, the intermediate frequency input 250 of the Gilbert cell 200 is coupled to the base terminals of the respective transistors 242a and 242b. Additional balancing of the input currents of the modulation stages 220 and 230 is achieved by an additional offset voltage applied to the base terminals of the transistors 242a and 242b by means of a conventional voltage control circuit 260 including a Digital to Analog Converter. Due to the amplification of the transistors, however, the conventional current control circuit 260 may require a rather high resolution.

Figure 2:
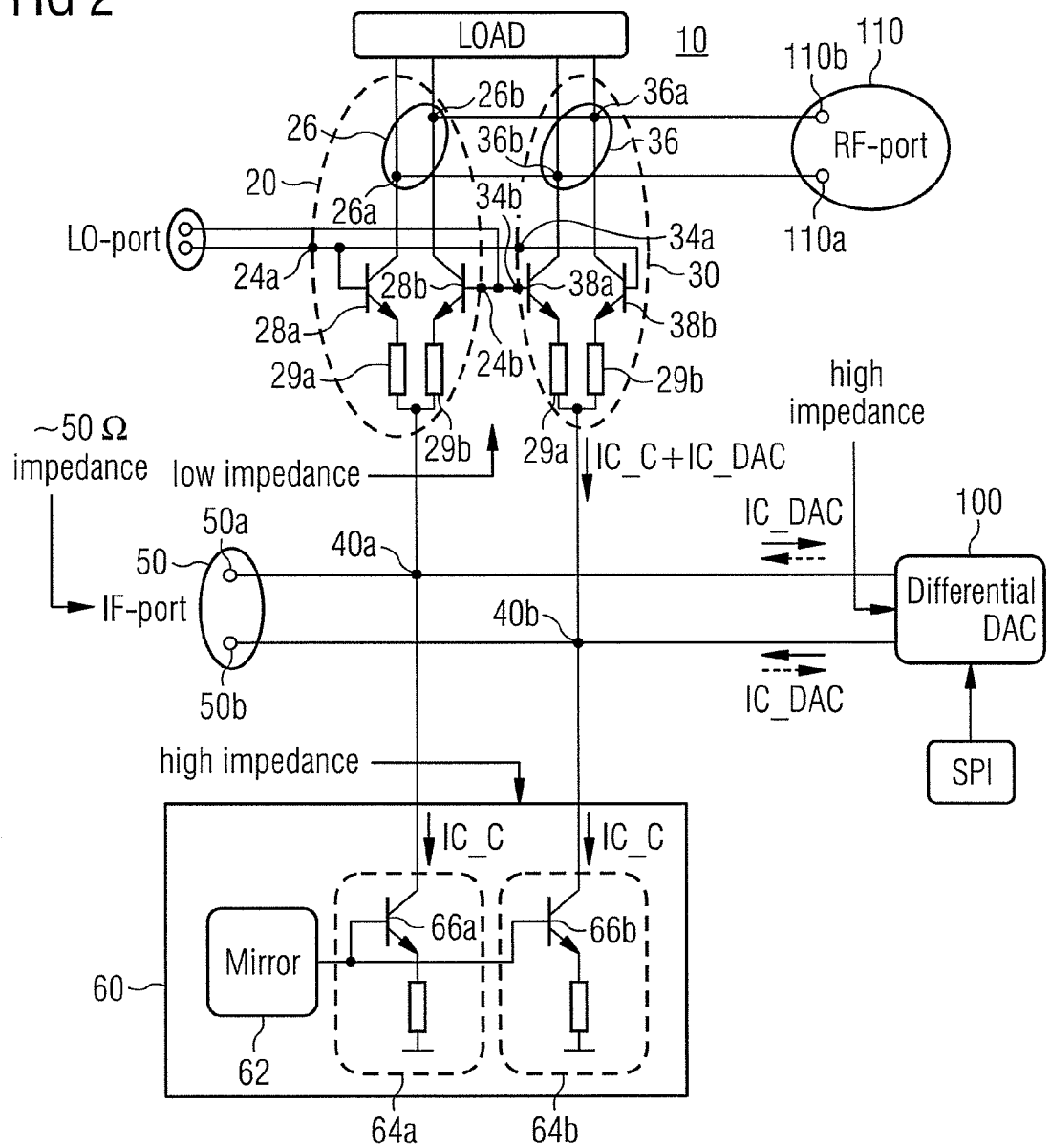
FIG. 2 illustrates a further embodiment of a mixing stage.

When the current is superimposed directly to the inputs of the modulating stages 20 and 30 as according to the embodiment of FIGS. 1 and 2, a smaller resolution may be sufficient in order to achieve a comparable result. That is, mixing stages according to some embodiments may use circuitry with a significantly lower complexity. This may also translate into cheaper devices requiring less semiconductor area and production costs as well as providing for a better reliability or long-term stability due to a decrease in complexity.

According to further embodiments, the current control circuit 100 according to FIG. 1 is adapted to modify the offset current in finite quantities. According to some embodiments, for example, FIG. 2, the current control circuit 100 comprises a digital-to-analog converter to control the offset current in an efficient manner. The resolution of the digital-to-analog converter may be significantly smaller as compared to conventional approaches and, for example, be less than 10 bits or even below, for example 4, 5, 6, 7, 8 or 9 bits. Further embodiments, however, may also use another arbitrary number of bits. A lower resolution of the digital-to-analog converter may be sufficient due to direct superposition of the offset current to either one or both of the common nodes 40a or 40b. According to some embodiments, the current control circuit 100 is adapted to superimpose a first offset current to the common node 40a and a complementary offset current to the second common node 40b so as to superimpose a current of the same magnitude to the first common node 40a and to the second common node 40b. To this end, a complementary signal or current shall be understood as a current which has the same magnitude but opposite phase. Generally speaking, a complementary signal, be it current or voltage, shall be understood to be a signal of equal amplitude but with opposite phase.

According to some embodiments, the current generation circuit 60 is adapted to support the direct superposition of an offset current to the first common node 40a and to the second common node 40b. To this end, the current generation circuit 60 comprises two independent current sources, i.e. a first current source coupled to the first common node 40a and a different second current source coupled to the second common node 40b.

With respect to FIG. 1 it may also be noted that a mixing stage as illustrated therein may be used for both, up-mixing of a signal or down-mixing of a signal. In either case, the signal comprising information to be processed by the mixing stage is provided to the information input signal. In the up-mixing application, as for example within a sending amplifier of a mobile telecommunication device, the signal provided to the information signal input may be the intermediate frequency signal, while the local oscillator signal may be a signal oscillating with the desired carrier frequency used for transmission of the radiofrequency signal. To this end, some of the following embodiments may denote the information signal input as an intermediate frequency (IF) input, when up-mixing scenarios are described.

To the contrary, when down-mixing is performed, the radiofrequency signal, as for example received over a wireless transmission, is provided to the information signal input. In that event, the radiofrequency signal comprises the information to be processed or to be reconstructed. Similarly, the local oscillator frequency signal would correspond to the carrier frequency and a signal component having the intermediate frequency may be derived at a modulation signal output.

To this end, further embodiments of mixing stages supporting down-mixing applications may comprise an impedance matching circuit coupled between the current control circuit 100 and the first common node 40a and the second common node 40b. The impedance matching circuit is operable to increase an input impedance of the current control circuit 100 so as to avoid current from leaking into the current control circuit when the radiofrequency signal is provided to the information signal inputs in the down-mixing application. This may avoid current leakage into the current control circuit itself when the same has an inherently low input impedance at high frequencies.

According to further embodiments of mixing stage 10, the first modulation stage 20 is a balanced mixing stage and also the second modulation stage 30 is a balanced mixing stage. Balanced mixing stages may provide LO-suppression capabilities, i.e. suppression of a signal component oscillating with the local oscillator frequency within the signal provided at the first modulation signal output 26 and at the second modulation signal output 36. Hence, the leakage of local oscillator signal components may be reduced further or, the requirement to superimpose offset currents at the first common node 40a and at the second common node 40b may be reduced. This may result in current control circuits with lower resolution. Mixing stages according to those embodiments may also be denoted as double-balanced mixing stages since they have inherent balancing capabilities with respect to the information signal as well as with respect to the local oscillator signal.

A practical implementation of a double-balanced mixing stage according to an embodiment is illustrated in FIG. 2. The application is designed for up-mixing of the signal provided at the information signal input 50, which may hence also be denoted as intermediate frequency signal input. The embodiment of FIG. 2 comprises the basic components of FIG. 1 so that the following description of the embodiment of FIG. 2 will partly rely on the description of FIG. 1 and, hence, only differences will be briefly discussed.

As already said, the mixing stage 10 of FIG. 2 is a double-balanced mixing stage and, hence, the first modulation stage 20 and the second modulation stage 30 are themselves balanced in order to provide inherent low-signal suppression at the first modulation signal output 26 of the first modulation stage 20 and at the modulation signal output 36 of the second modulation stage 30. The information signal input 50 is operable to receive an input signal as an information signal as well as a phase-inverted representation of the input signal so as to allow a balanced or differential mode of operation. According to further embodiments, however, the information signal input may also be operable to receive a single input signal and the modulation stage 10 itself may be operable to derive the phase-inverted representation of the input signal by means of appropriate circuitry. Since both of the modulation stages 20 and 30 are balanced, the local oscillator input supports a differential input of the local oscillator signal and of a phase-inverted representation of a local oscillator signal. To this end, the first local oscillator input 24 comprises a first terminal 24a adapted to receive the local oscillator signal and a second terminal 24b adapted to receive a phase-inverted representation of the local oscillator signal. Equivalently, the second modulation circuit comprises a second local oscillator input 34 having a first terminal 34a and a second terminal 34b.

In order to provide for a differential output allowing for balancing the signal, the first modulation signal output 26 comprises a first node 26a and a second node 26b. The first modulation stage 20 provides a first modulated sub-signal depending on the local oscillator signal and on the input signal at the first node 26a and a second modulated sub-signal depending on the phase-inverted representation of the local oscillator signal and on the input signal at the second node 26b. In the particular example embodiment of FIG. 2, the first modulated sub-signal at the first node 26a is generated by means of a first transistor 28a and the second modulated sub-signal at the second node 26b is generated by means of a second transistor 28b. The emitters of the transistors 28a and 28b are coupled to the common node 40a, and hence, receive the current of the input signal as provided by the information signal input 50. The base terminal of the first transistor 28a is controlled by the local oscillator signal 24a and the base terminal of the second transistor 28b is controlled by the phase-inverted representation of the local oscillator signal. The collector terminals of the first transistor 28a and the second transistor 28b are coupled to the first node 26a and to the second node 26b, respectively. Further, load-resistors 29a and 29b are associated with the transistors 28a and 28b and coupled between the emitter of the transistors 28a and 28a and the first common node 40a. The particular implementation of the modulation stages 20 and 30 is based on bi-polar NPN-transistors in FIG. 2. Further embodiments may also use other implementations, as for example PNP-transistors, field-effect transistors (FET) or the like. Since the emitter current of each of the transistors 20a or 20b is modulated by or corresponding to the current of the input signal while the base current is, at the same time, modulated by the local oscillator signal, the current at the first node 26a and the second node 26b essentially corresponds to a multiplication of the two currents. In particular, the frequencies of alternating current signals are added within the signal provided at the first node 26a and the second node 26b. By subtracting the signals at the first node 26a and the second node 26b, contributions of the local oscillator signal may principally be suppressed to some extent.

The second modulation stage 30 relies on the same principles so that the components within the second modulation stage 30 are only enumerated shortly. The second modulation stage 30 comprises a third transistor 38a and a fourth transistor 38b as well as two resistors 29a and 29b. The modulation signal output 36 furthermore comprises a third node 36a and a fourth node 36b. The third node 36a provides a third modulated sub-signal depending on the local oscillator signal and on the phase-inverted representation of the input signal. The fourth modulated sub-signal provided at the fourth node depends on the phase-inverted representation of the local oscillator signal and on the phase-inverted representation of the input signal.

In order to achieve suppression of DC components within the information signal input, the nodes 26a, 26b, 36b and 36a are cross coupled to one another resulting in a subtraction of the respective signal components due to the fact that output nodes which depend on phase-inverted inputs are coupled to each other so that the signals sum up. In particular, node 26a depending on the information signal is coupled to 36b depending on the phase inverted representation of the input signal. To this end, a mixing signal output 110 of the mixing stage 10 comprises a first terminal 110a and a second terminal 110b. The first terminal 110a is coupled to the first node 26a and to the fourth node 36b whereas the second terminal 110b is coupled to the second node 26b and to the third node 36a.

In order to allow for the direct superposition of an offset current by means of a current control circuit 100, the current generation circuit 60 comprises two independent current sources controlled by means of a common current mirror 62. That is, a first current source 64a is coupled to the first common node 40a and a second, different current source 64b is coupled to the second common node 40b. In the particular implementation of FIG. 2, the first current source 64a is formed by means of a further transistor 66a having its base terminal controlled by a current mirror 62 and the second current source 64b is formed by the equivalent transistor 66b having its base current also controlled by a current mirror 62. The embodiment of FIG. 2 provides for a high input impedance of the current control circuit 100 as well as for a high input impedance for the current generation circuit 60. To this end, a current may be directly superimposed to the first common node 40a and to the second common node 40b by the current control circuit 100 and, hence, serve to additionally balance the output of the first modulation stage 20 with respect to the second modulation stage 30 if necessary.

The doubly-balanced mixing stage as illustrated in FIG. 2 is sometimes also called a Gilbert cell. Hence, embodiments may also be denoted as Gilbert-cells having a current control circuit 100 coupled to a first common node 40a between a current generation circuit 60 and an input to a first modulation stage 20 as well as to a second common node 40b between the current generation circuit 60 and an input to the second modulation stage 30.

FIG. 3 shortly illustrates a conventional approach as to how additional balancing of the signal at the output of a Gilbert cell can be achieved. In the conventional approach of FIG. 3, the current at the inputs of the first and second modulation stages 220 and 230 is modulated by a modulation of the current of the base terminals of the current sources 242a and 242b. That is, the intermediate frequency input 250 of the Gilbert cell 200 is coupled to the base terminals of the respective transistors 242a and 242b. Additional balancing of the input currents of the modulation stages 220 and 230 is achieved by an additional offset voltage applied to the base terminals of the transistors 242a and 242b by means of a conventional voltage control circuit 260, including a Digital to Analog converter. Due to the exponential characteristics of the transistors, however, the conventional current control circuit 260 may require a much higher resolution as compared to embodiments to achieve a fine tuning of the balanced current. Hence, its implementation complexity may be much higher than the complexity of the corresponding current control circuit 100 of an embodiment.

Figure 4:
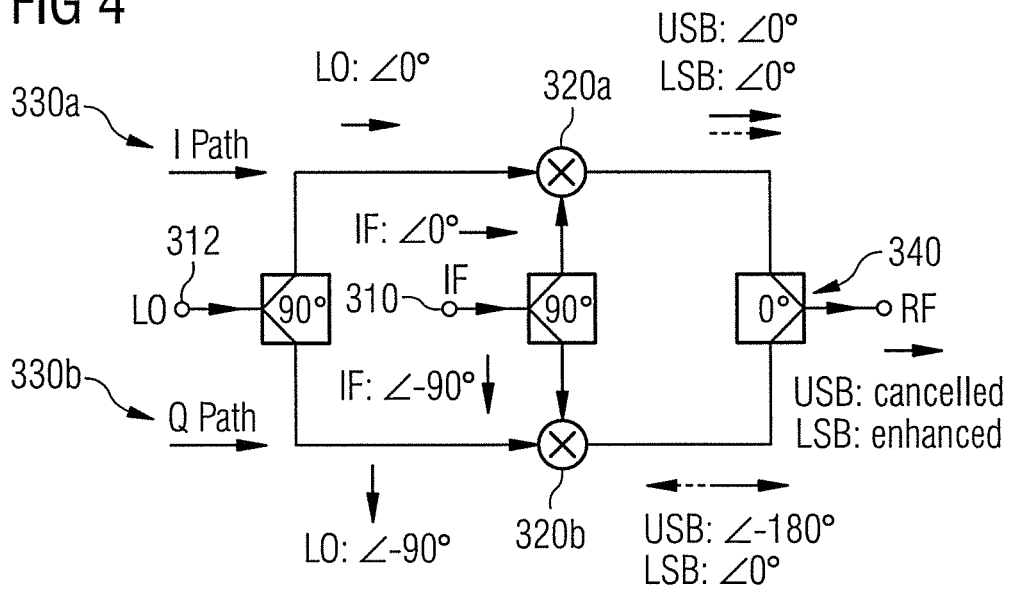
FIG. 4 illustrates a conventional Hartley Modulator.

FIG. 4 illustrates a possible application of a mixing stage according to an embodiment. In particular, FIG. 4 illustrates a Hartley-modulator for generating a single-side band modulated signal. In particular the up-conversion of an intermediate frequency or information signal 310 is schematically illustrated in FIG. 4. The Hartley-modulator is also denoted as I/Q-modulator, since the individual signals to be mixed, i.e. the carrier frequency signal or LO-signal 312 and the intermediate frequency signal 310 or information input signal are used both as an in-phase and as a quadrature component. The single-side band modulator comprises a first mixing stage 320a in the in-phase path 330a and a second mixing stage 320b in the quadrature-path 330b. A first input to the first mixing stage 320 in the I-path is the local oscillator signal 312 without phase shift and the second input to the first mixing stage 320 is the intermediate frequency signal 310 without a phase shift. The second mixing stage 320b, however, receives a phase-shifted representation of the local oscillator signal as well as a phase-shifted representation of the intermediate frequency signal. In particular, the local oscillator signal is phase-shifted by −90° with respect to the local oscillator signal 312 in the I-path 330a. The intermediate frequency signal is phase-shifted by −90° at an input of the second modulator 320b. Since both of the mixing stages 320a and 320b generate output signals ideally comprising frequencies at $f_{lo}+f_{if}$ and $f_{lo}-f_{if}$, the output signals as provided by the mixing stages 320a and 320b have particularly beneficial phase relations of those two signal components with respect to each other. In particular, the upper frequency component or the upper image having the frequency $f_{lo}+f_{if}$ of the Q-path 330B is phase-shifted by −180° with respect to the same signal component in the I-path. Summing the signals of the I-path 330a and of the Q-path 330b at an output 340 of the Hartley-modulator principally cancels the upper side band signal (USB). If modulator stages providing for an inherent carrier suppression, i.e. a suppression of the local oscillator signal, are used, a signal may be derived at an output of the Hartley modulator which only has frequency components at the desired frequency of $f_{lo}-f_{if}$, while the image having $f_{lo}+f_{if}$ as well as the leaking component of the local oscillator frequency $f_{lo}$ is suppressed.

Figure 5:
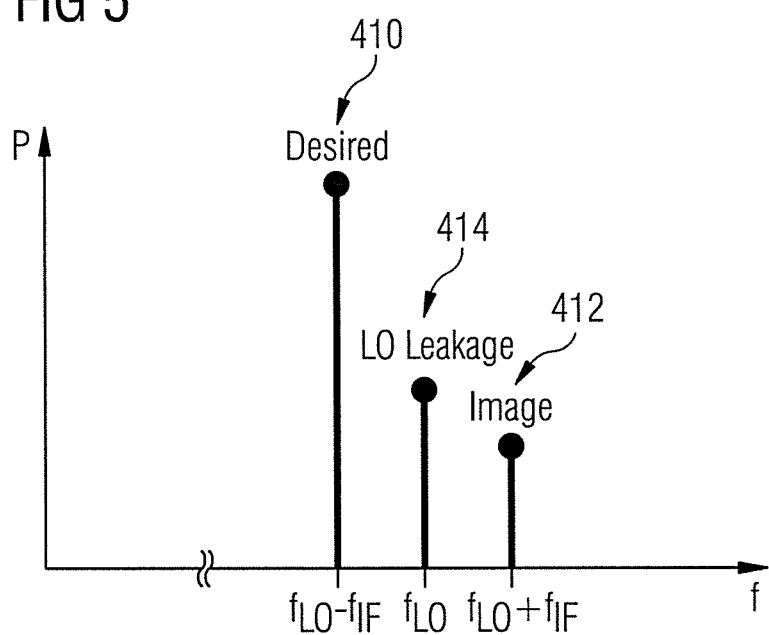
FIG. 5 illustrates signal characteristics of the Hartley Modulator of FIG. 4.

However, due to the inherent disturbances to the signals as well as to the imperfections within the provided local oscillator intermediate frequency signals, both components are normally present within conventional Hartley-modulator implementations. That is, the output spectrum of a Hartley-modulator or a single-side band modulator as illustrated in FIG. 4 generally comprises all of those components, which is schematically illustrated in FIG. 5. For the single-side band modulator, the desired signal component, i.e. the desired side band is centered around $f_{lo}-f_{if}$. A portion of the not completely suppressed image, i.e. an image-side band 412 is centered around $f_{lo}+f_{if}$ while an undesirable component of the local oscillator signal 414 is situated at $f_{lo}$. In applications where the carrier frequency is much higher than the intermediate frequency so that the distance between the carrier frequency 414 and the desired side band 410 is small, it may be practically impossible and furthermore energy-wasting to apply filters to the output signal so as to try to filter the frequency component at $f_{lo}$ and beyond.

Figure 6:
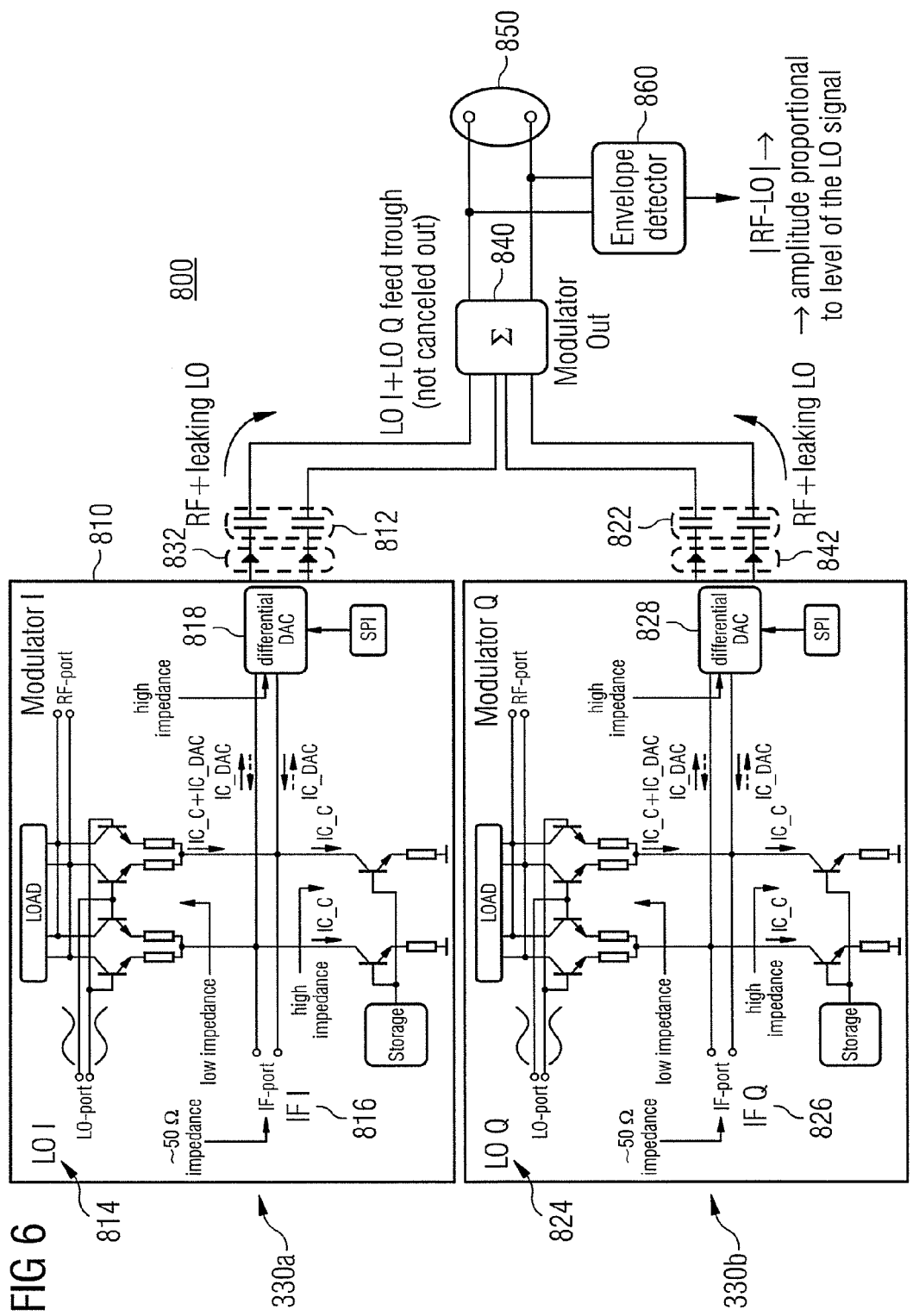
FIG. 6 illustrates an embodiment of a modulator circuit for providing a single side band modulated signal.

Use of embodiments of mixing stages within the modulator circuits may provide for the possibility of efficiently suppressing the LO-leakage of the local oscillator frequency 414 within the single-side band modulated signal. FIG. 6 illustrates schematically an embodiment of a modulator circuit 800 for providing a single-side band modulated signal. The modulator circuit 800 comprises a first mixing stage 810 and a second mixing stage 820 according to an embodiment. The first mixing stage 810 has a first mixing stage output corresponding to the mixing signal output 110 of FIG. 2. The first mixing stage 810 is used within the I-path 330a of the modulator circuit 800 and the second mixing stage 820 is used within the Q-path 330b of the modulator circuit. Consequently, the first local oscillator signal 814 of the first mixing stage has a phase relation of 90° with respect to the corresponding local oscillator signal 824 of the second mixing stage 820. The same applies to the intermediate frequency signals or the information signals 816 of the first mixing stage 810 with respect to the intermediate frequency or information input signal 826 of the second mixing stage 820.

The modulator circuit 800 further comprises a signal combiner 840 adapted to combine the signal of the first mixing stage output 812 with the signal of the second mixing stage output 822 to provide a representation of the single-side band modulated signal at an output 850 of the modulator. That is, the signal combiner may be operable to add the signals of the output of the first mixing stage 810 and of the second mixing stage 820 in order to provide a single-side band modulated signal having the signal component of the image side band strongly reduced or, ideally, completely suppressed.

Optional RF buffers 832 and 842 may also be placed between the mixing signal output of the mixing stages 810 and 820 and the mixing stage outputs 812 and 822, respectively, in order to improve the phase balance of the signals provided to the signal combiner 840.

According to the particular embodiment of FIG. 6, the modulator circuit 800 furthermore comprises an optional envelope detector 860 which is coupled to the output 850 of the signal combiner 840. In order to be able to control the first and/or the second mixing stage 810 and 820 properly, the single-side band signal analyzer is adapted to determine the presence of a contribution of a signal oscillating with the local oscillator frequency within the signal at the output 850 of the signal combiner 840. The envelope detector 860 is coupled to the current control circuit 818 of the first mixing stage 810 and/or to the current control circuit 828 of the second mixing stage 820. The coupling can be performed by means of a MCU.

Figure 7:
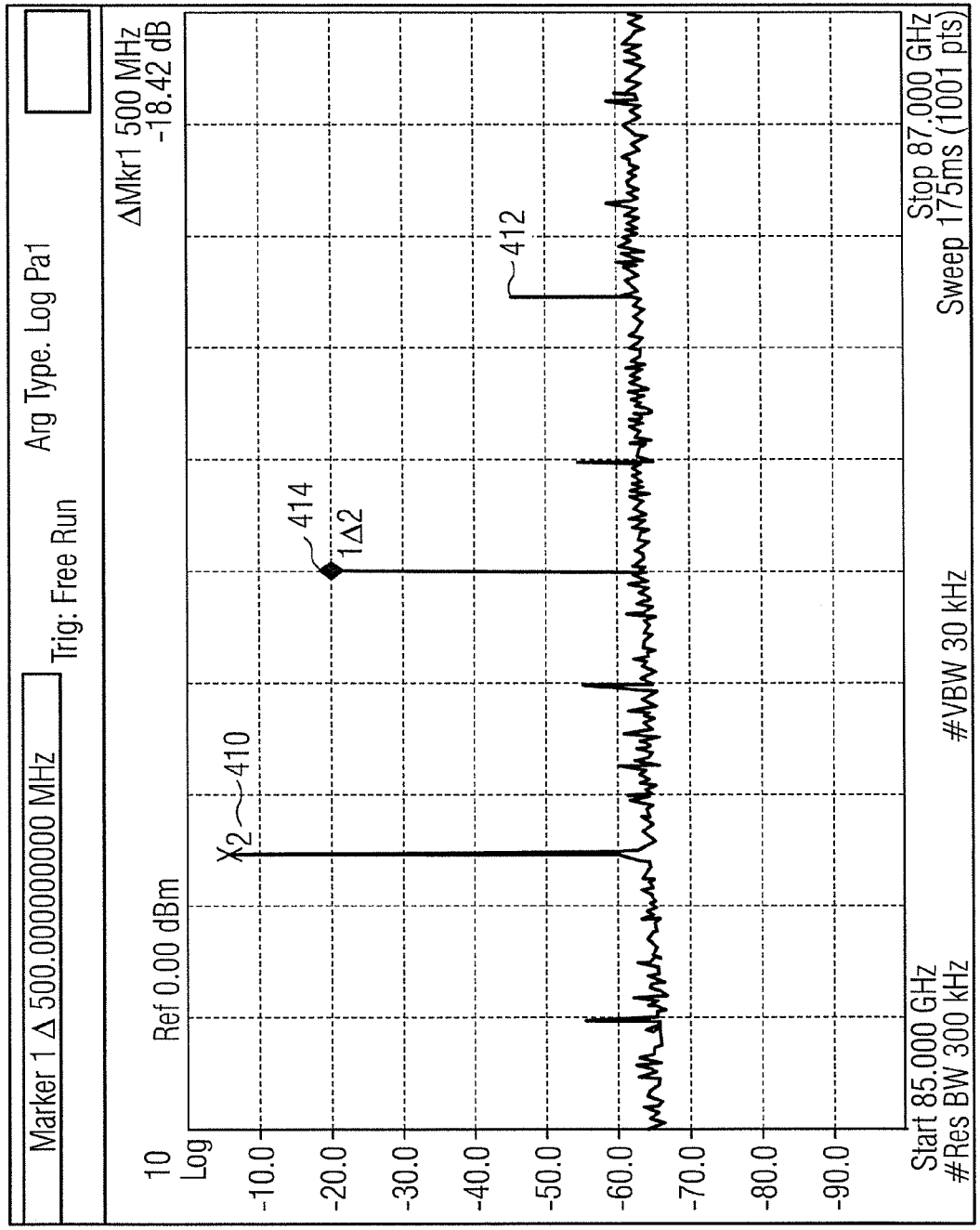
FIG. 7 illustrates signal characteristics of a conventional modulator circuit for providing a single side band modulated signal.
Figure 8:
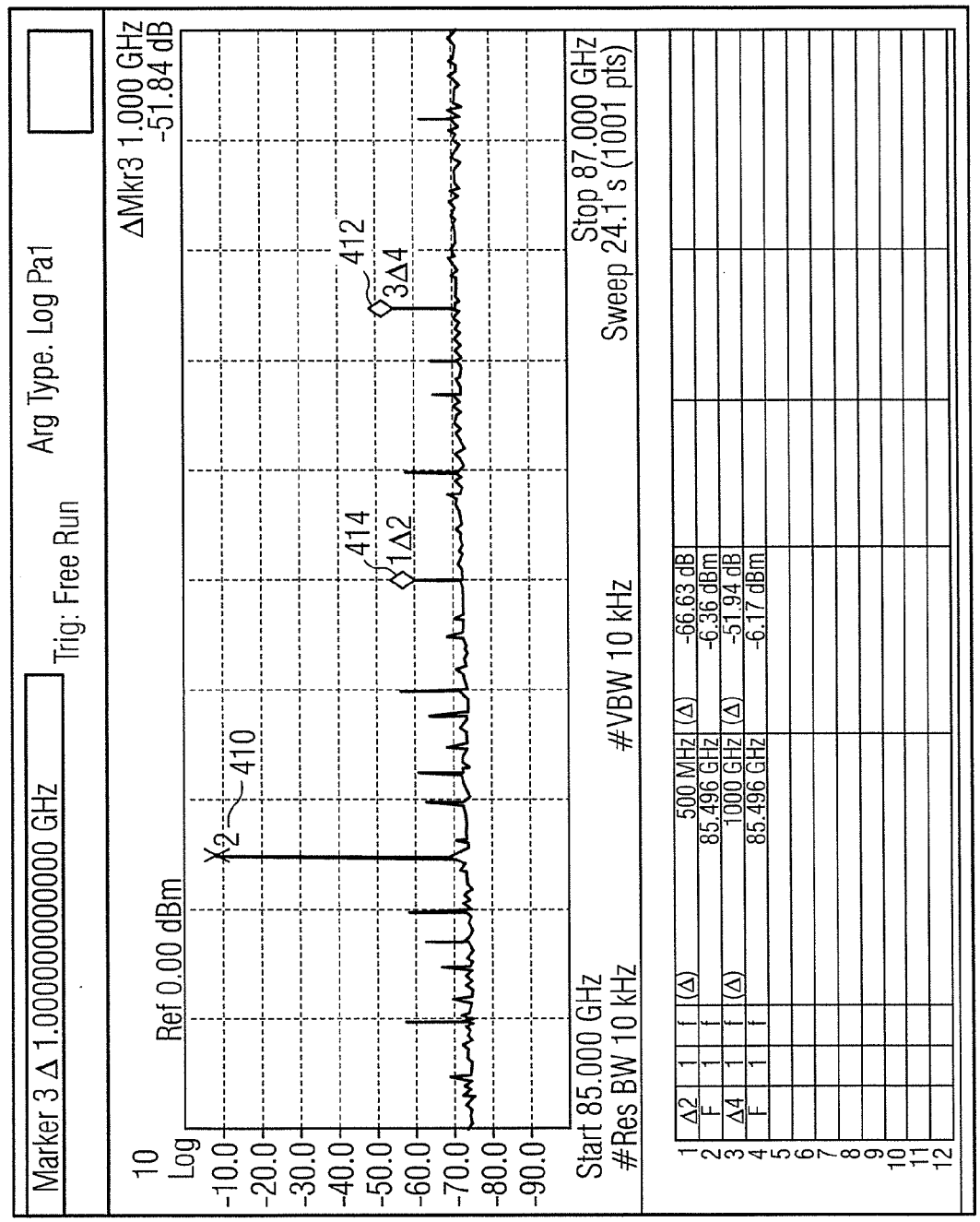
FIG. 8 illustrates signal characteristics of an embodiment of a modulator circuit for providing a single side band modulated signal.

FIGS. 7 and 8 illustrate to what an extent the presence of a signal component corresponding to the local oscillator frequency or the carrier frequency may be suppressed within the single-side band modulated signal provided by the modulator circuit of FIG. 6.

To this end, a frequency spectrum of an output of the modulator circuit 800 of FIG. 6 is illustrated in FIG. 7. The Y-axis illustrates the spectrum starting from 85 GHz and ending at 87 GHz. The carrier frequency, i.e. the frequency of the local oscillator signal is chosen to be 85.5 GHz and the intermediate frequency of the information signal is chosen to be 500 MHz for illustrative purposes. FIG. 7 illustrates the performance of the modulator circuit of FIG. 6 without the use of the single envelope detector 860. The Y-axis of the spectrum of FIG. 7 illustrates the power at the output 850 of the modulator circuit 800 in the event that a sinusoidal signal is provided as an intermediate frequency signal at the information signal inputs of the mixing stages 810 and 820. As illustrated in FIG. 7, the desired lower side band 410 contains the most power within the output signal. However, also the undesired upper side band image 412 is clearly visible at a frequency of 86 GHz. Also, a strong LO-leakage is illustrated in image 414. That is, a component oscillating with a local oscillator frequency contributes to a rather high fraction to the output power within the signal at the output 850 of the modulator circuit 800. As illustrated in FIG. 7, the contribution of the local oscillator signal in the output spectrum amounts to roughly −18.4 dB.

FIG. 8 illustrates the same spectrum in the event that the envelope detector 860 is operational and appropriately controls the current control circuits 818 and 828, respectively. In particular, the envelope detector 860 may control digital-to-analog converters (DAC) within the current control circuits to appropriate values. As illustrated in FIG. 8, the contribution of the local oscillator signal 414 can be decreased by a considerable amount, down to about −56 dB and even lower than the contribution of the undesired upper side band signal, amounting to roughly −51.9 dB.

FIG. 8 thus illustrates to what extent the desired carrier frequency or local oscillator frequency suppression may be achieved by using embodiments of mixing stages as disclosed before.

Figure 9:
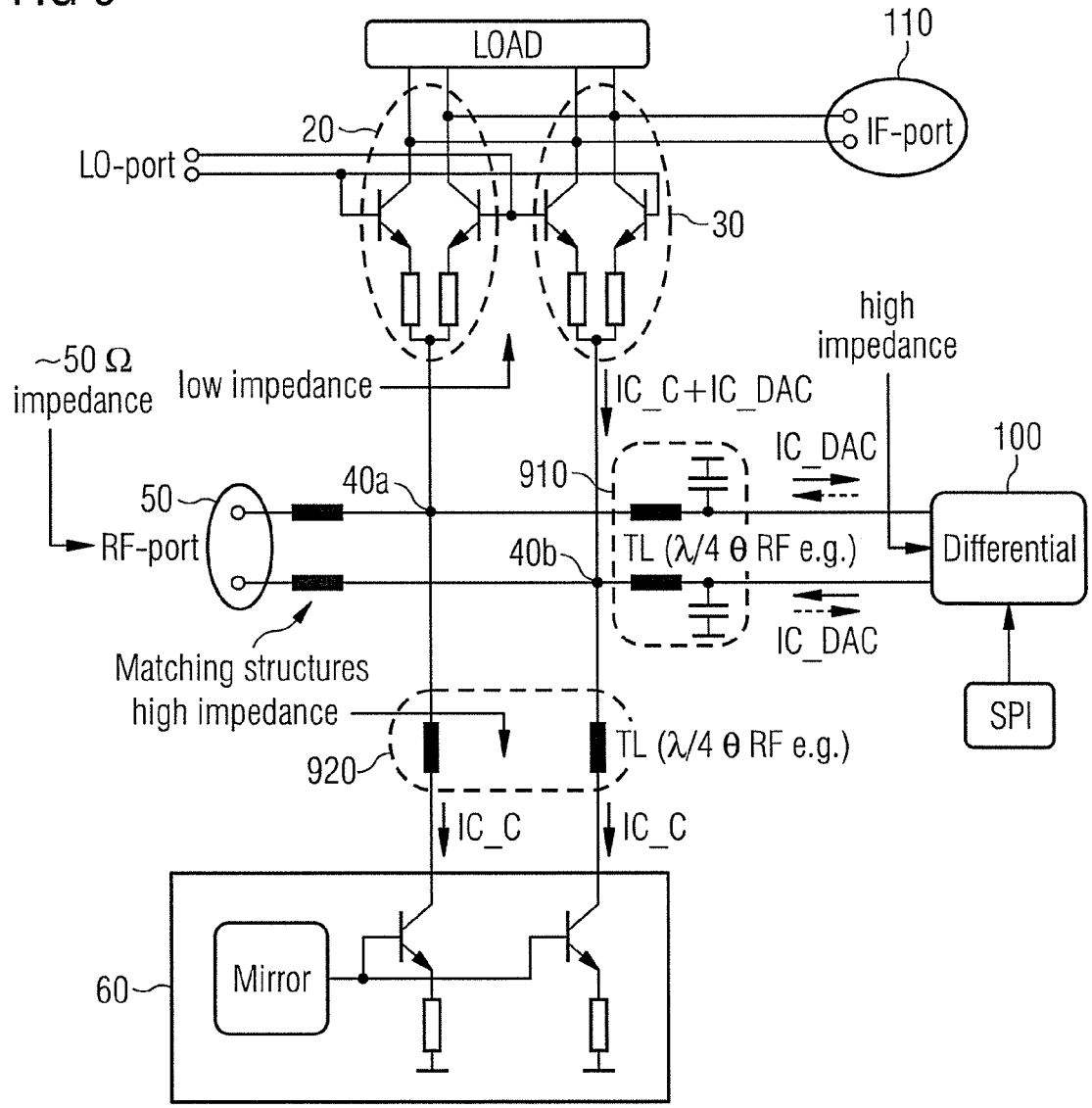
FIG. 9 illustrates a further embodiment of a mixing stage.

FIG. 9 illustrates a down mixing application of an embodiment. That is, further embodiments may be used within a mixing stage used for down-conversion. This application may result in a better DC-offset and a better IP2, when the balance of the circuit is increased by means of an embodiment as illustrated in FIG. 9. When an embodiment is used as a down-converter, the application of the signal to the information signal input 50 is changed. In the particular embodiment used for down-conversion, the radiofrequency, i.e. the modulated carrier frequency as received by some receive antenna circuits may be applied to the information signal input 50 and the intermediate frequency is provided at the mixing signal output 110 of the circuit. This could also be denoted as swapping the radiofrequency and intermediate frequency ports of the mixing stage 10 of FIG. 2. In the down-converting configuration of FIG. 9, additional impedance matching circuits 910 and 920 may be present. For example, an impedance matching circuit 910 may be coupled between the current control circuit 100 and the first common node 40*a* as well as the second common node 40*b*. The impedance matching circuit may serve to increase the input impedance of the current control circuit 100, when the inherent input impedance of the current control circuit 100 is not sufficiently high at the high carrier frequency as opposed to the lower intermediate frequency in the application of FIG. 2. In the particular example of FIG. 9, a $\lambda/4^{th}$ transmission line is used as an impedance matching circuit in order to prevent current flowing into the current control circuit 100 rather than into the modulation stages 20 and 30 as required. Any other circuitry may also be used as an impedance matching circuit 910 in order to provide for the functionality, if required. In other words, any kind of radiofrequency-choke (RF-choke) may be placed in series to the output of the current control circuit in order to avoid leaking of the radio frequency signal. For the same purpose, additional impedance matching circuits 920 may be applied between the output of the current source 60 and the first common node 40*a* and the second common node 40*b*.

While FIG. 9 illustrates a current generation circuit 60 along the lines of the current generation circuit 60 of FIG. 2, further embodiments may use a simplified current generation circuit, where the two current sources of the embodiment of FIG. 9 are merged to become a single current source.

Figure 10:
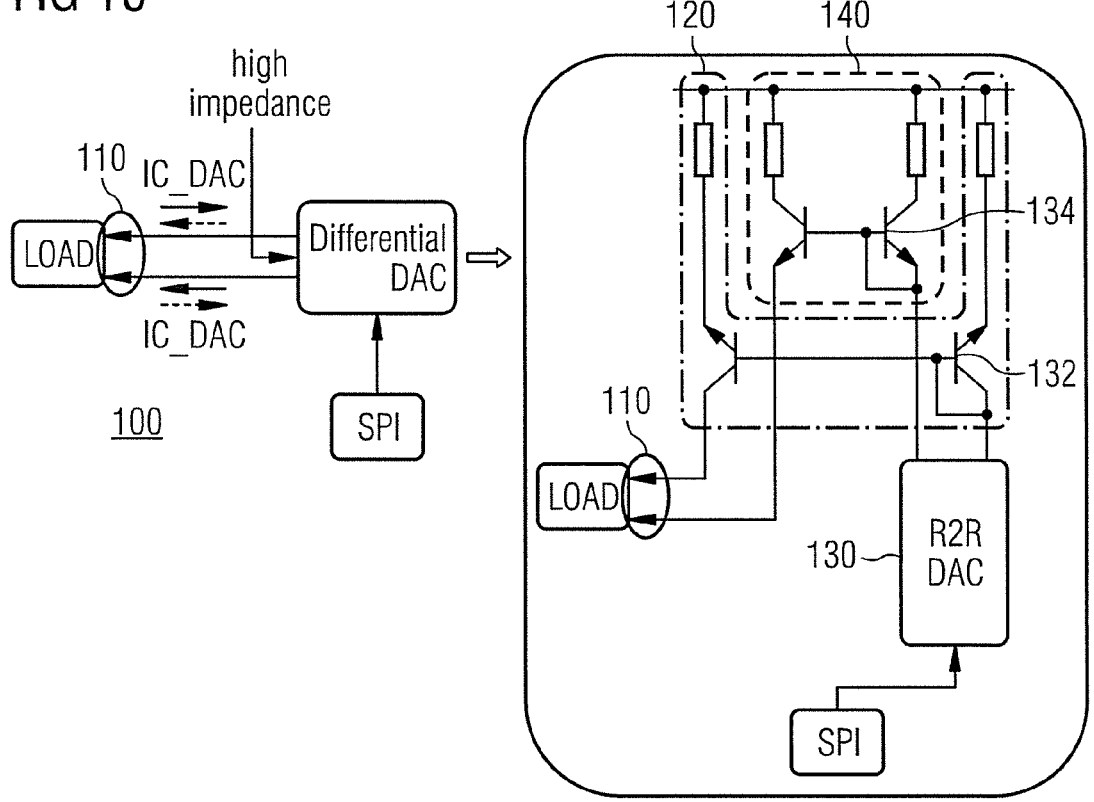
FIG. 10 illustrates an embodiment of a current control circuit for a mixing stage.

FIG. 10 illustrates a particular embodiment as to how a current control circuit 100 may be implemented in order to serve as a current control circuit 100 within a mixing stage according to an embodiment.

The current control circuit 100 has an output terminal 110 for superimposing an offset current to a current provided to an information signal input of a mixing stage. The current control circuit is illustrated in schematic terms in the left illustration of FIG. 10, while the right illustration gives an example of a practical implementation of an embodiment of a current control circuit 100.

The current control circuit has an output terminal 110, illustrated as a load in FIG. 10. The output terminal serves for providing an output current for superimposing an offset current to a current provided to an information signal input of a mixing stage, as for example the mixing stage illustrated in FIGS. 1 and 2. The current control circuit further comprises a current mirror circuit 120 which is adapted to provide the output current, wherein the current mirror circuit 120 is coupled to the output terminal 110. In the particular embodiment of FIG. 10, a digital-to-analog converter 130 is coupled to the current mirror circuit 120 such that a variation of the output voltage of the digital-to-analog converter 130 causes a variation of the output current of the current mirror circuit 120. In the particular implementation of FIG. 10, it is possible to directly couple an output of the digital-to-analog converter 130 to a control terminal 132 or a base terminal of a transistor of the current mirror 120. Further embodiments are operable to supply complementary offset currents. To this end, current control circuit 100 may furthermore comprise a second current mirror circuit 140 adapted to provide a phase-inverted representation of the offset current at the output 110. To this end, a differential digital-to-analog converter 130 may be used, having a second output coupled directly to a control terminal of a further transistor 134 of the current control circuit.

Figure 11:
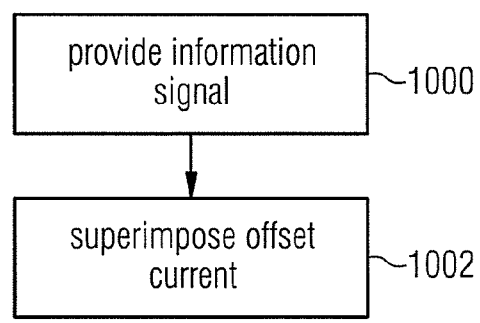
FIG. 11 illustrates an embodiment of a method for providing a modulated signal.

For the sake of completeness, an embodiment of a method for balancing a mixing stage having a first modulation stage and a second modulation stage, a current generation circuit adapted to provide a supply current to a first common node and a second common node coupled to the input of the first and second modulation stages is illustrated as a flow chart in FIG. 11.

The method comprises providing an information signal to the first common node and to the second common node at 1000.

The method further comprises superimposing an offset current to the current of at least one node of the first common node and the second common node at 1002, so that the offset current is directly superimposed to the current of the information signal.

Embodiments may further provide a computer program having a program code for performing one of the above methods, when the computer program is executed on a computer or processor or a Micro Controller Unit MCU. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A mixing stage, comprising:
   a first modulation stage comprising:
     a first input adapted to receive an input signal, the input being coupled to a first common node of the mixing stage,
     a first local oscillator input adapted to receive a local oscillator signal oscillating with a predetermined local oscillator frequency, and
     a first modulation signal output adapted to provide a first modulated signal depending on the local oscillator signal and on the input signal;
   a second modulation stage comprising:
     a second input adapted to receive a phase inverted representation of the input signal, the second input being coupled to a second common node of the mixing stage,
     a second local oscillator input adapted to receive the local oscillator signal, and
     a second modulation signal output adapted to provide a second modulated signal depending on the local oscillator signal and on the a phase inverted representation of the input signal;
   an information signal input coupled to the first common node and to the second common node;
   a current generation circuit adapted to provide a supply current, the current generation circuit being coupled to the first common node and to the second common node; and a current control circuit coupled to the first common node and to the second common node, the current control circuit being adapted to superimpose an offset current to the current of at least one node of the first common node and the second common node.

2. The mixing stage of claim 1, wherein the current control circuit is adapted to modify the offset current in finite quantities.

3. The mixing stage of claim 2, wherein the current control circuit comprises a digital to analog converter adapted to control the offset current.

4. The mixing stage of claim 3, wherein the digital to analog converter has a resolution of less than 10 bits.

5. The mixing stage of claim 1, wherein the current control circuit is adapted to superimpose a first offset current to the first common node and a second offset current to the second common node, the second offset current being complementary to the first offset current.

6. The mixing stage of claim 1, wherein the current generation circuit comprises a first current source coupled to the first common node and a second, different current source coupled to the second common node.

7. The mixing stage of claim 1, further comprising an impedance matching circuit coupled between the current control circuit and the first common node and between the current control circuit and the second common node, the impedance matching circuit being operable to increase an input impedance of the current control circuit.

8. The mixing stage of claim 1, wherein
the first modulation stage is a balanced mixing stage comprising a first node and a second node within the modulation signal output, the first modulation stage being operable to provide a first modulated sub signal depending on the local oscillator signal and on the input signal at the first node and to provide a second modulated sub signal depending on a phase inverted representation of the local oscillator signal and on the input signal at a second node; and wherein
the second modulation stage is a balanced mixing stage comprising a third node and a fourth node within the modulation signal output, the second modulation stage being operable to provide a third modulated sub signal depending on the local oscillator signal and on a phase inverted representation of the input signal at the third node and to provide a fourth modulated sub signal depending on a phase inverted representation of the local oscillator signal and on the phase inverted representation of the input signal at the fourth node; and wherein
a mixing signal output of the mixing stage comprises a first terminal and a second terminal, the first terminal being coupled to the first node and to the fourth node and the second terminal being coupled to the second node and to the third node.

9. The mixing stage of claim 1, wherein the information signal input comprises a third terminal coupled to the first common node and a fourth terminal coupled to the second common node, the third terminal being adapted to receive the information signal and the fourth terminal being adapted to receive a phase inverted representation of the information signal.

10. A modulator circuit for providing a single sideband modulated signal, the modulator circuit comprising:
a first mixing stage, comprising:
a first modulation stage comprising:
a first input adapted to receive an input signal, the input being coupled to a first common node of the first mixing stage,
a first local oscillator input adapted to receive a local oscillator signal oscillating with a predetermined local oscillator frequency, and
a first modulation signal output adapted to provide a first modulated signal depending on the local oscillator signal and on the input signal;
a second modulation stage comprising:
a second input adapted to receive a phase inverted representation of the input signal, the second input being coupled to a second common node of the first mixing stage,
a second local oscillator input adapted to receive the local oscillator signal, and
a second modulation signal output adapted to provide a second modulated signal depending on the local oscillator signal and on the a phase inverted representation of the input signal;
a first information signal input coupled to the first common node and to the second common node;
a current generation circuit adapted to provide a supply current, the current generation circuit being coupled to the first common node and to the second common node; and
a current control circuit coupled to the first common node and to the second common node, the current control circuit being adapted to superimpose an offset current to the current of at least one node of the first common node and the second common node; and
a first mixing stage output, the first mixing stage output being coupled to the first modulation signal output and to the second modulation signal output of the first mixing stage; and
a second mixing stage, comprising:
a third modulation stage comprising:
a third input adapted to receive the input signal, the input being coupled to a third common node of the second mixing stage,
a third local oscillator input adapted to receive the local oscillator signal oscillating with the predetermined local oscillator frequency, and
a third modulation signal output adapted to provide a third modulated signal depending on the local oscillator signal and on the input signal;
a fourth modulation stage comprising:
a fourth input adapted to receive the phase inverted representation of the input signal, the fourth input being coupled to a fourth common node of the second mixing stage,
a fourth local oscillator input adapted to receive the local oscillator signal, and
a fourth modulation signal output adapted to provide a fourth modulated signal depending on the local oscillator signal and on the phase inverted representation of the input signal;
a second information signal input coupled to the third common node and to the fourth common node; and
a second current generation circuit adapted to provide a supply current, the second current generation circuit being coupled to the third common node and to the fourth common node; and
a second current control circuit coupled to the third common node and to the fourth common node, the current control circuit being adapted to superimpose an offset current to the current of at least one node of the third common node and the fourth common node; and a second mixing stage output, the second mixing stage output being coupled to the third modulation signal output and to the fourth modulation signal output of the second mixing stage; and a signal combiner adapted to combine the signal of the first mixing stage output and of the second mixing stage output to provide a representation of the single side band modulated signal.

11. The modulator circuit of claim 10, further comprising an envelope detector coupled to the output of the signal combiner, the envelope detector being adapted to determine the presence of a contribution of a signal oscillating with the local oscillator frequency within the signal at the output of the signal combiner.

12. The modulator circuit of claim 11, wherein the envelope detector is coupled to the current control circuit of the first mixing stage and to the current control circuit of the second mixing stage and adapted to control the current control circuits such that the contribution of the signal oscillating with local oscillator frequency is decreased.

13. The modulator circuit of claim 10, further comprising:

a first RF buffer between the first mixing stage output and the first modulation signal output and the second modulation signal output of the first mixing stage; and a second RF buffer between the second mixing stage output and the third modulation signal output and the fourth modulation signal output of the second mixing stage.

* * * * *